(12) United States Patent
Stöcker et al.

(10) Patent No.: US 9,763,365 B2
(45) Date of Patent: Sep. 12, 2017

(54) MOBILE DATA CENTRE UNIT WITH EFFICIENT COOLING MEANS

(75) Inventors: Horst Stöcker, Oberursel (DE); Volker Lindenstruth, Mainz (DE)

(73) Assignee: GSI Helmholtzzentrum für Schwerionenforschung GmbH, Darmstadt (DE)

( * ) Notice: Subject to any disclaimer, the term of this patent is extended or adjusted under 35 U.S.C. 154(b) by 129 days.

(21) Appl. No.: 14/236,417

(22) PCT Filed: Jul. 3, 2012

(86) PCT No.: PCT/EP2012/062924
§ 371 (c)(1),
(2), (4) Date: Apr. 10, 2014

(87) PCT Pub. No.: WO2013/017358
PCT Pub. Date: Feb. 7, 2013

(65) Prior Publication Data
US 2014/0209272 A1    Jul. 31, 2014

(30) Foreign Application Priority Data
Aug. 1, 2011   (EP) ..................................... 11006326

(51) Int. Cl.
*H05K 7/20* (2006.01)
*H05K 7/14* (2006.01)

(52) U.S. Cl.
CPC ....... *H05K 7/20818* (2013.01); *H05K 7/1497* (2013.01); *H05K 7/2079* (2013.01)

(58) Field of Classification Search
CPC ............ H05K 7/20818; H05K 7/1497; H05K 7/2079; H05K 7/1485; H05K 7/20709; H05K 7/20745; H05K 7/20754; H05K 7/20736; H05K 7/20827; G06F 15/161; H02B 1/30; H02B 361/616; H02B 1/565
USPC ............. 361/701, 379.48, 679.53, 616, 676; 165/47, 59; 312/223.1, 236
See application file for complete search history.

(56) References Cited

U.S. PATENT DOCUMENTS

| 4,733,331 A * | 3/1988 | Chauvet ................ H01L 23/427 165/80.4 |
| 7,278,273 B1 * | 10/2007 | Whitted .................... G06F 1/16 361/690 |
| 7,864,530 B1 | 1/2011 | Hamburgen et al. |

(Continued)

FOREIGN PATENT DOCUMENTS

| CA | 2729390 A1 | 1/2010 |
| DE | 102008030308 A1 | 12/2009 |

(Continued)

OTHER PUBLICATIONS

PCT International Search Report, PCT App No. PCT/EP2012/062924, Int. Filing Date: Jul. 3, 2012, Date of Mailing: Aug. 31, 2012.

(Continued)

*Primary Examiner* — Stephen Sul
(74) *Attorney, Agent, or Firm* — Reising Ethington PC (57) ABSTRACT

The present disclosure relates to a mobile data center unit, which is adapted to house at least one rack being designed to provide storage space for electronic equipment. The mobile data center unit is equipped with passive cooling means in order to provide dissipation of heat being generated by the electronic equipment.

30 Claims, 4 Drawing Sheets

(56) References Cited

U.S. PATENT DOCUMENTS

| | | | |
|---|---|---|---|
| 8,320,125 B1* | 11/2012 | Hamburgen | H05K 7/2079 165/104.33 |
| 2003/0147216 A1 | 8/2003 | Patel et al. | |
| 2004/0050231 A1* | 3/2004 | Chu | H05K 7/2079 83/574 |
| 2006/0077776 A1 | 4/2006 | Matsushima et al. | |
| 2006/0232945 A1 | 10/2006 | Chu et al. | |
| 2008/0123288 A1* | 5/2008 | Hillis | H05K 7/20745 361/679.34 |
| 2008/0270572 A1 | 10/2008 | Belady et al. | |
| 2008/0273306 A1 | 11/2008 | Campbell et al. | |
| 2009/0133866 A1 | 5/2009 | Campbell et al. | |
| 2010/0078157 A1* | 4/2010 | Roth | H05K 7/20745 165/104.34 |
| 2010/0290190 A1 | 11/2010 | Chester et al. | |
| 2011/0036107 A1* | 2/2011 | Muir | F28D 15/02 62/89 |
| 2011/0157829 A1* | 6/2011 | Wormsbecher | H05K 7/1497 361/701 |
| 2011/0175498 A1 | 7/2011 | Bash et al. | |
| 2011/0220324 A1 | 9/2011 | Lindenstruth et al. | |
| 2012/0025679 A1* | 2/2012 | Roering | B64D 11/0007 312/236 |
| 2012/0300398 A1* | 11/2012 | Eckberg | H05K 7/2079 361/692 |
| 2014/0209272 A1 | 7/2014 | Stocker et al. | |

FOREIGN PATENT DOCUMENTS

| | | | | |
|---|---|---|---|---|
| DE | CA 2729390 A1 * | 1/2010 | ............ | E04H 5/02 |
| EP | 2555605 A1 | 2/2013 | | |

OTHER PUBLICATIONS

European Office Action, Application No. 11 006 323.0-1803, Applicant: GSI Helmholtzzentrum fur Schwerionenforschung GmbH, Dated of Mailing: Dec. 20, 2013.

China Office Action, Application No. 201280038026.4, Applicant: GSI Helmholtzzentrum Fur Schwerionenforschung GmbH, Title: Mobile Data Centre Unit with Efficient Cooling Means, Mail Date: Apr. 8, 2015.

European Office Action, Application No. 12 733 087.6-1803, Applicant: GSI Helmholtzzentrum Fur Schwerionenforschung GmbH, Mail Date: Apr. 8, 2016.

Arab Emirates Examination Report, Application No. 0103/2014, Filing Date: Jan. 30, 2014, Applicant: GSI Helmholtzzentrum Fur Schwerionenforschung GmbH.

Arab Emirates Search Report, Application No. 0103/2014, dated Jan. 30, 2014, Applicant: GSI Helmholtzzentrum Fur Schwerionenforschung GmbH.

* cited by examiner

MOBILE DATA CENTRE UNIT WITH EFFICIENT COOLING MEANS

BACKGROUND

In the prior art, there exist various data centre building structures for housing a multiplicity of racks, each of which comprising storage space for electronic equipment.

Conventional data centres most typically are buildings which comprise a false floor for a computer infrastructure, which is typically housed in 19" rack enclosures. The cooling is accomplished by cold air, which is pumped into the false floors having holes at appropriate locations in front of the racks. In this way cold air is supplied at the air intakes of the computer racks.

A typical conventional data centre building according to the state of the art is shown in FIG. 1 of WO 2010/000440. This conventional design is somehow disadvantageous, because the single racks have to be designed as closed racks and the air flow through respective racks has to be surveyed and controlled in order to avoid pumping of unnecessary amounts of cold air from the cold aisle.

There exist various concepts, providing a regulation of the air flow into the cold aisle, such that the fans providing the air flow operate at the lowest possible power. The hot air generated by the equipment inside the rack is fed back to heat exchangers being located somewhere else in the data centre building. The heated air is either cooled down again or fresh air is used in order to provide a stream of cold air.

Beside the typical conventional data centre building according to the state of the art WO 2010/000440 discloses a new energy efficient architecture for multi-story computer data centres using liquid cooling media for dissipation of heat being generated by the IT equipment. The so called Green-IT concept realized by WO 2010/000440 allows the reduction of energy consumption for cooling purposes. Conventional data centres often require 50% or more of their energy consumption of the electronic components for cooling purposes. The novel cooling concept of WO 2010/000440 enables data centres which require less than 10% (PUE<1.1; where "PUE" stands for "Power Usage Effectiveness" and is calculated by PUE=total facility power/IT equipment power) of its energy for cooling.

The stationary multi-story computer data centre of WO 2010/000440 becomes a kind of benchmark for later Green-IT concepts to follow, as a constant development towards energy efficient data centres exists. However, stationary computer data centres require a constant demand for such centres and therefore are considered as long-time investments. Quite often, however, there exists only a temporary demand for computer power, or a demand for computer power increases unexpectedly within a short time span. Therefore, there exists a strong need towards mobile data centre containers, which can easily be installed in the near neighbourhood and contain their own infrastructure so that they can be "plugged-in" where stationary computer data centres are undersized and/or only a temporary need for computing power exists.

SUMMARY

The present disclosure relates to a mobile data centre unit, which is adapted to house at least one rack being designed to provide storage space for electronic equipment. The mobile data centre unit is equipped with cooling means in order to provide dissipation of heat being generated by the electronic equipment.

Therefore, a mobile data centre unit is suggested that comprises:
(i) at least one container,
(ii) the at least one container comprising at least one rack for housing electronic equipment,
(iii) the at least one rack comprising at least one heat exchanging means being adapted to transfer heat generated by the electronic equipment to be contained inside the rack to a fluid coolant, said heat exchanging means being located at at least one wall or element of the at least one rack,
(iv) at least one coolant conduit which is adapted to supply the heat exchanging means of the at least one rack with a fluid coolant and is further adapted to convey the heated coolant away through a reflux section of the coolant conduit,
(v) connecting means for connecting the at least one coolant conduit to at least one external heat exchanging device,
(vi) said at least one rack being designed and arranged in a way that the internal airflow within the rack is predominantly effectuated by passive means and/or by rack-independent means.

The present mobile data centre unit can provide for a mobile data centre unit, in particular for a container and/or a plurality of containers, avoiding the necessity of guiding the cooling air across the racks through special air vents. Further, the presently suggested mobile data centre unit allows to optimise energy requirements and cost and/or allows to arrange the computer racks more densely in order to minimize the required lengths of the network cables and to improve the system's communication capabilities.

The presently suggested mobile data centre unit can provide a compact structure of a data centre unit comprising larger, scalable storage capacities and/or an increased storage volume. According to a further aspect of the presently suggested mobile data centre unit, more than one of the individual mobile data centre units, such as containers, can be arranged in a cluster, e.g. by arranging and/or stacking the units/containers in two or three dimensions. According to such an embodiment, there is no need that each mobile data centre unit/container has its own chiller (or a different type of external heat exchanger device for cooling down the fluid coolant), because the coolant conduits/cooling circuits can simply be expanded by a further mobile data centre unit/container using the chiller (or a different type of external heat exchanger device) of an adjacent container having a chiller (external heat exchanger device).

Furthermore, the presently suggested mobile data centre unit can provide a data centre unit, in particular a container, with an increased packing or storage density for electronic equipment, such as power electronics, IT equipment and/or computer hardware, which provides a sufficient heat dissipation, which can even exceed a volumetric heat dissipation rate of 1, 2, 3, 4, 5, 6 or 7 kW per $m^3$. For practical reasons the volumetric heat dissipation rate usually does not exceed 8 kW per $m^3$. In particular, it is possible that at least one rack of the presently suggested mobile data centre unit comprises electronic equipment, in particular power electronics, IT equipment and/or computer equipment. However, in principle all types of equipment can be stored in one or a plurality of racks of the mobile data centre unit. In particular, even equipment, producing a significant amount of (waste) heat can be stored within the one or plurality of racks.

Unit:

According to a preferred embodiment of the mobile data centre unit, the unit comprises a container or comprises even a plurality of containers. Preferably such a container has the size of a container according to accepted standards which can preferably be transported, loaded and unloaded, stacked and transported efficiently over long distances by http://en.wikipedia.org/wiki/Flatcar ship, rail, trucks, semi-trailer trucks or planes. As an example, common ISO containers can be used for this. Most preferred are 20-ft (6.1 m), 40-ft (12.2 m), 45-ft (13.7 m), 48-ft (14.6 m), and 53-ft (16.2 m) long containers. The width typically is 10 ft (3.0 m) to 8 ft (2.4 m) and the height typically is 9 ft 6 in (2.9 m). However, different types of (standardised) containers can be used as well. Just to give some examples: UIC-containers (where UIC stands for Union Internationale de Chemin de Fer), CC-Containers (a wide-spread container system in Europe), river barge containers (optimised for Europool palettes; common in Europe), airfreight containers, transport containers for easy pickup and delivery with trucks can be advantageously used.

The container or the plurality of containers can have one central electrical power input, which is preferably located at the outside of the container, to supply electricity to the computer hardware, and means for distributing the electrical power inside the container from the central power input to the individual racks.

Racks:

Typically the racks are common 19" rack enclosures. In a preferred embodiment, the racks are tall racks which are particularly space-saving. The racks can be placed on the floor of the container bottom. Pipes and/or cable trays can be mounted above, below and/or at the rear side of the racks (preferably at a high and/or a low position at the rear side of the rack). Of course, cable channels can be provided as well, in particular above, below and/or at the rear side of the racks (preferably at a high and/or a low position at the rear side of the rack). According to a further preferred embodiment, the racks are connected to the container via shock-absorbing means, thus protecting the racks and any associated/connected means, like heat exchanging means and coolant pipes, against vibration and shock during transportation and assembly.

Preferably, in the presently suggested mobile data centre unit, the at least one heat exchanging means is arranged, at least in part, on the back wall of the at least one rack and/or the at least one rack is designed, at least in part, as an open rack. The term "open" in connection with the present racks can mean that the front of the racks is (partially) open and allows the equipment inside the rack to intake room air without or at least with reduced flow resistance. As an example, a front door can be completely missing, at least over a certain height interval of the rack. It is also possible to have a fluidly open front door, e.g. a lattice door, which allows air to flow through without substantial flow resistance.

Another possible advantage of the rack-based heat exchanging means is that the racks themselves do not have to be kept closed and that the air flow into and out of the racks does no longer have to be guided in a controlled way (e.g. by providing channels and/or air vents). As a further benefit, inside the data centre container, there are not necessarily required additional air conditioners, as the cooling function may be completely taken over by the heat exchanging means inside the racks, at least on the time average. By the suggested performance "on the time average" one can, for example, run the contained electronic equipment in an "overdrive" mode for a limited time span (typically in the order of several minutes). During this time span, it is possible that the interior of the container rises in temperature by a certain amount. If, however, after this "overdrive" time interval a compensating time interval is initiated, during which the electronic equipment is run in a mode, generating less waste heat (as compared to the amount of heat that can be absorbed by the heat exchanging means), the temperature within the container can be brought back to "normal".

The at least one rack of the presently suggested mobile data centre unit is designed and arranged in a way that the internal airflow within the rack is at least in part and/or at least at times predominantly effectuated by passive means and/or by rack-independent means. As an example for a "passive means", a chimney effect due to the heating of the air within the rack by waste heat of the components, arranged within the rack, can be used. The inventors have surprisingly discovered, that such a chimney effect can be sufficient to generate a sufficiently strong air stream, even (or particularly when) equipment, generating a significant amount of waste heat, is stored within the at least one rack. In particular the at least one rack can be designed and arranged in a way that a heat dissipation rate of at least 1 kW, preferably at least 5 kW, even more preferred at least 10 kW, particularly at least 15 kW per rack can be handled. The design can particularly relate to the dimensions of the at least one heat exchanging means, arranged at least one wall or element of the at least one rack. However, the design can relate to the size of internal spaces for allowing air to pass by and/or to the path that is foreseen for the air flow, for example. In particular, it is possible that the rack itself does not have any other means, in particular no fans, for creating an air flow in the rack towards the heat exchanging means.

It is possible, however, that the internal airflow within at least one rack is effectuated at least at times and/or at least in part by active means of at least a part of the electronic equipment to be contained in the rack. As an example, if IT equipment is arranged in the respective racks, such IT equipment typically has active means, like fans, for cooling parts of the IT equipment. As a well-known example, the CPU and/or the GPU and/or memory banks and/or storage hardware of the IT equipment is typically equipped with a cooling fan, already. Preferably such active means that are provided for cooling parts of the IT equipment can create at least a (certain or even a significant) part of an air flow in the rack towards the heat exchanging means being located at at least one wall or element of the at least one rack.

Due to the unique design, the presently suggested mobile data centre unit does not necessarily require false floors and cold aisles arrangements or designs.

It is preferred to use a design for the mobile data centre unit, wherein at least one of the heat exchanging means is designed at least in part as an air flow penetrable heat exchanging means. Typically, such air flow penetrable heat exchanging means can be designed in a way that a large contact surface with the air flowing through the heat exchanging means can be provided, thus increasing the effectiveness of the heat exchanging means. In particular, heat exchanging means (in particular air flow penetrable heat exchanging means) can be designed with corrugated ribs for further increasing the contact surface available for the air passing through. Most preferred are heat exchangers having a depth between 50 mm and 80 mm, particularly of about 65 mm which cause only a very low air back pressure, while still having a high effectivity. Therefore hot air leaving the electronic equipment in the racks can pass the heat exchanger all by itself.

Heat Exchanging Means:

The at least one rack of the presently suggested mobile data centre unit can comprise at least one heat exchanging means, located at at least one wall or element of the at least one rack. In particular, the at least one heat exchanging means can be located at an outer wall of the at least one rack, preferably at a back wall (rear wall) and/or top wall of the rack. Even more preferred, the back wall (side wall) of the rack can comprise hinges in a way that it is has the functionality of some kind of a swingable door.

According to the presently suggested mobile data centre unit, the dimensions of the heat exchangers are chosen with such a size that they are capable of removing the entire heat generated by the electronic equipment to be stored within the rack (for example power electronics, IT equipment and/or computer hardware), at least on the time average. An implementation according to a particularly preferred embodiment of the presently suggested mobile data centre unit can support up to 35 kW cooling power per rack. Therewith, it can be ensured that no heat is released to the data centre. The air entering the racks, typically from the front side, and the air leaving the racks, typically at the back side, usually have the same or essentially the same temperature and substantially all the heat generated can be removed by the heat exchanger and the cooling liquid.

Furthermore, the heat exchanging means can directly receive the hot air generated by the electronic equipment to be stored inside the rack and may cool down this hot air down to a desired room temperature by simply transferring the heat to the coolant within the coolant conduit. In this way, any release and/or routing of hot air inside the data centre container can be avoided.

Also, the distance over which hot or heated air travels can be reduced to a minimum. Usually, it is only required to transport the heated air inside the rack, in particular from the electronic equipment to the heat exchanging means. In this way, any difficult-to-control turbulent air flow can usually be prevented.

According to another preferred embodiment of the disclosure, the racks and/or the heat exchanging means themselves do not comprise any active means, such as fans, for guiding the heat/hot air from the electronic equipment to the surface of the heat exchanging means. The relatively low and laminar stream of air that is established by passive means and/or obtained from the active cooling means of the electronic equipment (for example of CPU cooling fans and/or GPU cooling fans) inside the particular rack typically allows to avoid additional fans and allows to avoid any additional fan power consumption.

Depending on coolant flow and air flow inside the rack cooling capabilities up to 35 kW or 40 kW per 19" rack can be achieved. For racks exceeding the above mentioned size the cooling capabilities can be even higher.

Coolant Conduit/Cooling Circuit:

The heat exchanging means of the racks are preferably connected to a coolant conduit which supplies fluid coolant, preferably liquid coolant, to each of the heat exchanging means, for example through a piping system. When the mobile data centre unit is set up in an operational mode, typically the coolant conduits are connected with other piping to form closed cooling circuits. Of course, it is possible to design the system in a way that at least at times at least a part of a liquid coolant evaporates within the heat exchanging means, so that the latent heat consumed by evaporation can be used for cooling purposes as well.

In a preferred embodiment of the disclosure, the coolant conduit comprises a piping system to guide the coolant away from the heat exchanging means. Usage of a liquid coolant such as water and other suitable cooling fluids, particularly with larger thermal capacities than air, is often advantageous due to numerous reasons. At first, the total heat quantity that may be transferred and transported typically is, when compared to gaseous coolants, much larger. Secondly, it is possible to control and monitor the flow and the transmission of the coolant more easily, compared to a typically at least partially turbulent flow of a gaseous coolant. Thirdly, the cross sections to be provided for a coolant stream can usually be kept comparatively small.

Beyond that, it is recommended that the coolant is conveyed within at least parts of a coolant conduit, which may contain water or any other liquid having a comparably high thermal capacity, with a pressure lower than 2 bars, in particular lower than atmospheric pressure. Based on this, the risk of fractures in the coolant conduit system, and thus the risk of leakage can be kept comparatively small. Furthermore, at such a comparatively low pressure, the fluid is usually not escaping in form of a well-developed jet, so that even in case of a leakage, adverse effects can be better controlled and/or minimised. If the pressure used is below atmospheric pressure, it is even possible that smaller cracks in the piping system do not cause an immediate loss of coolant out of the piping system.

It is further suggested to provide the coolant conduit with at least one safety barrier, designed and arranged in a way to prevent any liquid (or fluid), in particular any leakage fluid/leakage liquid and/or any condensation liquid to come into contact with the electronic equipment. For this, guiding sheets, grooves, hollows and/or sinks can be provided that can be even designed in a way to collect any such liquid. In any case it is possible to prevent that any such liquid (for example leakage liquid/condensation liquid) comes into contact with the electronic equipment (e.g. computer hardware). At least part of the piping can be arranged on the outside surface of the respective wall of the rack (for example the rack's back door), which can protect the electronic equipment against water spills by way of a fine granular heat exchanger structure (for example by providing narrowly spaced corrugated ribs).

Additionally and/or alternatively, at least one sensor means for detecting and/or monitoring the pressure in the coolant conduit can be provided. This way, it is possible to detect any leakage in the piping system and preferably to set an alarm thus allowing to take appropriate measures against such a leakage. In case of a low pressure system the pumps can be stopped.

Further, according to typical embodiments of the presently suggested mobile data centre unit, no insulation of the piping system is required as the room temperature corresponds approximately to the cold coolant fluid (for example water) return temperature. The avoidance of any warm air inside the container room allows to have ambient temperatures of 20° C. or the like. Therefore there is a reduced, or even no risk of condensation.

The heat exchanging means can be arranged inside or in direct vicinity of a rack and/or are preferably adapted to transfer the entire heat generated inside the rack to the coolant. Therefore, the heat exchanging means of each rack to be cooled can provide a heat coupling between the provided coolant and the inner volume of the rack. The heat exchanging means is typically located at the back/rear side of the rack.

In summary, the mobile data centre unit/container comprises a coolant conduit to discharge the heat generated by the electronic equipment. Typically, the coolant conduit is designed to provide the racks with a coolant, and the coolant conduit can be designed to remove the coolant heated by the computer hardware of the racks.

Furthermore, the cooling conduit can be provided with connecting means for connecting the at least one coolant conduit to at least one external heat exchanging device. As connecting means essentially all devices known in the state of the art can be used. In particular, threaded nuts, threaded tube ends and flanges can be used for this purpose. Preferably, however, fast connecting connectors can be used, so that setting up and packing away the components of the mobile data centre unit is more user-friendly.

External Heat Exchanging Device/Chiller:

The mobile data centre unit can be connected to (or can even comprise) at least one external heat exchanging device. As an external heat exchanging device, at least one chiller, preferably a water chiller and/or a hybrid cooler device can be used. Usually, the external heat exchanging device will be located outside the respective unit (container) for cooling the coolant heated during operation of the mobile data centre unit, and means for conveying the heated coolant to the external heat exchanging device will be provided. However, in particular when the mobile data centre unit is packed up or transported, it is possible that at least a part of at least one heat exchanging device is stowed away in at least one container.

Preferably, at least parts of the at least one coolant conduit and/or at least parts of additional means for conveying coolant are designed as flexible means and/or comprise metal, steel, stainless steel and/or synthetic organic polymer materials. In particular, metal tubes can be made flexible if they are designed as corrugated tubes.

Preferably the at least one external heat exchanging device (e.g. a chiller) is directly attached to the unit or container. For transportation, it is possible to remove such an external heat exchanging device/chiller reversibly.

The chiller most typically is a counter flow, indirect draft, wet cooling tower, in which water is sprayed from the top of a column and cooled by evaporation of some of the water, while the water not evaporating can be collected downwards. In order to avoid contamination of the interior of the container (and thus possibly of the electronic equipment within the container) a first cooling circuit (that is usually arranged on the outside of the container and where a part of the primary cooling circuit can be formed the chiller) is separated from a second cooling circuit (that is partially located inside the container), according to a preferred embodiment. In this case, the first and second cooling circuit can be thermally connected to each other by a heat exchanger. For increasing the reliability of the system, typically two redundant heat exchangers are used. By way of this embodiment any contamination of the primary cooling circuit (which may be contaminated by air particles, such as pollen), can be prevented to be transferred to the second coolant circuit (partially) inside the container. The heat exchanging means and the necessary pumps are usually placed inside the container.

Depending on the environmental climate, in some geographical areas common water chillers can cause problems, e.g. during very cold/freeze periods and/or when the mobile data centre unit is not permanently in operation. In such cases it is preferred to use so-called hybrid cooling towers instead. Most typically such hybrid coolers comprise plate heat exchangers through which the heated coolant is flowing through and cooled by the environmental air. One example for a hybrid cooler is shown in U.S. Pat. No. 7,864,530.

To increase the cooling capacity in summer, it is possible to spray water onto the surface of the plate heat exchanger and to use the evaporation cooling of such water. Since these hybrid cooling towers include a heat exchanger no further heat exchangers are required. However, the cooling water typically requires additives, such as glycol in order to prevent it from freezing.

Further, the chiller (or other type of external heat exchanger) can have means for conveying the liquid coolant from the chiller to and from the respective connecting means of the mobile data centre unit. Typically, such means are pipes, preferably being flexible and/or made of different materials, such as steel, stainless steel and/or synthetic organic polymer materials.

Electronic Equipment Fans:

The mobile data centre unit/container contains at least one rack for housing electronic equipment or preferably already houses electronic equipment. Such equipment located in the racks usually comprises active means, such as fans, for cooling the respective equipment (or parts of it). Said active means, preferably fans, are preferably built-in in such a manner that the active means, such as cooling fans, provide or at least support an air flow through the rack (for example from the front of the equipment to its back), thus removing the heat generated by the electronic equipment by heating the air, flowing past the electronic equipment. This already present airflow can be used for creating and/or supporting and/or maintaining an airflow through the rack. The air, exiting the rack, can be cooled down by placing the heat exchanger in the vicinity of the airflow outlet opening (for example in the back of the racks). The heat exchangers can be designed in a way that they generate very little back pressure, so that the back pressure does not present a problem in case generic electronic equipment is contained in the racks. In a preferred embodiment of the disclosure an airflow of 3000 m3/h generates a back pressure of less than 20 Pa.

In particular, since the heat exchanging means usually comprises a rather large surface, the relatively slow and laminar stream of air obtained from the passive means and/or the active means of the electronic equipment (for example CPU cooling fans) inside the particular rack allows to avoid additional fans and allows to avoid any additional fan power consumption.

General System:

The present disclosure is preferably based on a complete rack-specific cooling system within the (high) rack arrangement and a transport mechanism in order to avoid the problem of how to provide and control a flow of cooling air through the entire data centre. Further, the coolant conduit usually requires little installation room only, thus reducing the volume needed for the data centre.

Most typically, most or even all computer hardware racks are individually connected to the coolant conduit, which provides an efficient instrument for removing and discharging the heat from the computer hardware.

Coupling each rack to be cooled to the coolant conduit individually (in particular as a separate, parallel fluid path to other fluid paths}, can have the additional advantage that it is possible to control and monitor the cooling power and heat exchange performance individually and separately for each individual rack within the structure of the data centre. Cooling the hot air exclusively within the rack makes it possible to install any rack package densities without requiring a special air flow design, such as cold aisles or hot aisles.

Based on this individual and separate cooling infrastructure it is possible to arrange the racks within the container as needed and even to re-arrange the rack arrangement depending on individual needs.

Beyond that, the cooling system presently proposed allows to use a so-called open rack architecture ensuring the racks do not need to be hermetically sealed anymore. Such open rack structure further allows easier access to the computer hardware inside the rack, in case of any problems or maintenance needed. Further, monitoring the electronic equipment stored within the racks can be done more easily. Due to the low pressure difference across the heat exchanger, openings that are normally present with standard racks (for example openings for passing through cables) are not disturbing the internal airflow of the respective rack significantly.

Another preferred embodiment of the presently suggested mobile data centre unit can be realised if at least some or all of the racks comprise at least one control means, preferably at least one switching control means, which is adapted to selectively switch off the hardware, rack and/or the relevant portion of the coolant conduit and/or if at least some or all of the racks comprise at least one monitoring control means, comprising at least one leak detector for the coolant conduit and/or at least one smoke detector. In this way, the entire system may adaptively locally react on local system failures and may automatically initiate respective actions in order to compensate the failure.

According to another embodiment, the control means further comprise temperature sensors, leak detectors for the coolant conduit and/or smoke detectors, whereby said detectors can be coupled to an emergency alarm system, which is adapted to selectively switch off the hardware, rack and/or the relevant portion of the coolant conduit.

The emergency system may be designed and arranged in any of said racks individually and can be designed and arranged separately from an emergency system of neighbouring or adjacent racks. Smoke and leakage detectors may be installed separately and independently from each other in order to individually switch off burning or smoking IT equipment and to be able to maintain all other operations of the data centre. Alternatively, it can be envisaged to use a combination of individual detectors and/or to use a multi-functional detector.

It is preferred if the mobile data centre unit comprises at least one regulating control means, regulating the functionality of at least one heat exchanging means and/or at least one external heat exchanging device and/or at least a part of the at least one fluid conduit. The heat exchanging means can be an internal heat exchanging means (in particular the heat exchanging means of at least one rack).

A control can be done, for example, by varying the speed of at least one pump for circulating coolant (thus influencing the coolant flow rate) and/or by varying the speed of at least one fan (for example a cooling fan) of an external heat exchanging means, like a (water) chiller. Also, the amount of water, sprayed onto a chiller, can be varied by the regulating control means, as well.

According to a further embodiment, the racks further comprise power scheduling means that are adapted to keep an overall rush-in electric current below a predefined threshold. This embodiment is adapted to prevent that the entire data centre draws an amount of energy which cannot be provided by an external power supply. Therefore, the power scheduling means are adapted to regulate that each rack or a pair/group of racks draws power from an electric current supplier or voltage supply according to a given time sheet.

For instance, a first rack may power-up after a given time-delay relative to any other rack of the data centre. In this way, peak-power consumption of the entire data centre can be kept below a predefined threshold, thus ensuring that the external power supply does not brake down. The power scheduling means may either be implemented as a specific algorithm assigning a predefined individual, hence different, time-delay to any of the racks of the data centre building.

Alternatively, it is also possible that a power switch-on of the various racks is controlled by means of a centralised architecture. However, also an interconnected emergency system is in the scope of the present disclosure, whereby a multiplicity of leak detectors and/or smoke detectors are electrically coupled to a central emergency system, which may automatically initiate respective actions in order to counteract a system failure.

According to another preferred embodiment, the data centre further comprises at least one further cooling circuit, for example a second cooling circuit, comprising the same principal structure as the first cooling circuit which takes over the duty of the first cooling circuit in case of any leakage or other problem.

According to yet another preferred embodiment, all pumps in the mobile data centre unit have a redundant backup pump, which can be activated in case of a primary pump failure. Proper shut-off valves allow the replacement of a broken pump while the system is still operating.

The compact architecture of the preferred embodiment allows the operation of the mobile data center unit at relatively high ambient temperatures. Such higher temperatures of fluid coolant allows a more efficient cooling. In case the coolant temperature approaches 30° C. (in particular in the reflux line of the coolant conduit, i.e. after the coolant is heated by the waste heat), the heat accumulated from the computer hardware may be used for heating purposes.

According to a further embodiment, the mobile data centre container may have an additional steel support structure, preferably a double-T beam structure, to increase the stability of the container and/or to serve as a support for the computer hardware racks. In addition, such steel support structure may further serve as a guiding and support structure for a lifting device, being adapted to transport and to lift entire racks or to support handling of heavier computer hardware items.

Cooling Efficiency:

According to another preferred embodiment of the mobile data centre unit a 3 m wide 40 ft standard container is equipped with a minimum of 13 19" racks, which operate at 20 kW each. The total power of 260 kW is cooled by a hybrid cooler. The water pump requires 14 kW and the hybrid cooler requires an additional 4 kW, if the outside temperature is above a certain margin (for example 15° C.), which results in a power utility efficiency of PUE=1.06. This efficiency is even further improved his each rack has a power density of more than 20 kW up to 35 kW.

Furthermore, a rack device is suggested, in particular a rack, for housing electronic equipment, wherein
(i) the rack device comprises storage space for the electronic equipment and
(ii) at least one heat exchanging means is provided, being adapted to transfer heat generated by the electronic equipment to be contained inside the rack to a fluid coolant, said heat exchanging means being located at at least one wall or element of the at least one rack,
(iii) at least one coolant conduit which is adapted to supply the heat exchanging means of the at least one rack with a fluid coolant and is further adapted to convey the heated coolant away through a reflux section of the coolant conduit,
(iv) said at least one rack being designed and arranged in a way that the internal airflow within the rack is predominantly effectuated by passive means and/or by rack-independent means.

The presently suggested rack can have at least some of the features, characteristics and advantages, as previously described, at least in analogy. Furthermore, it can be modified in the previously described sense as well. This way, the same characteristics and advantages can be achieved with the rack, as well, at least in analogy.

In particular, the suggested rack can be used for containing electronic components with substantial heat dissipation. In particular, the already described numbers for heat dissipation are applicable in the present context as well.

However, the presently suggested rack can be used on a more universal level. In particular, its use is not only restricted to mobile data centre units. Instead, the rack can be used for different purposes, like for stationary buildings, as well. In particular, the presently suggested rack cannot only be used for retrofitting already existing data centre buildings. Instead, usually it is even possible to "convert" already existing buildings having a different purpose to data centre buildings, when using the presently suggested rack. This is, because the presently suggested rack does not need a special infrastructure, to be supplied by the building. Instead, normally standard rooms (perhaps equipped with some kind of an air conditioning) can be used, if the presently suggested rack is employed.

Protection scope can include as well a data centre container which is suitable for housing at least one of the forementioned racks, which are equipped with electronic equipment, in particular electronic equipment with a high heat dissipation, like storage electronic equipment or which can be equipped with electronic equipment for a data centre according to the above mentioned features. The data centre container can comprise a central electrical power input, preferably located at the outside of the container and means for distributing the central electric power from the central power input to the individual racks. The power density of the computer hardware in the racks can herein exceeds up to 35 or 40 kW, but at least be more than 5, 10 or 15 kW.

DESCRIPTION OF DRAWING FIGURES

In the following, the disclosure will be described in detail by making reference to the drawings in which.

DETAILED DESCRIPTION

Figure 1:
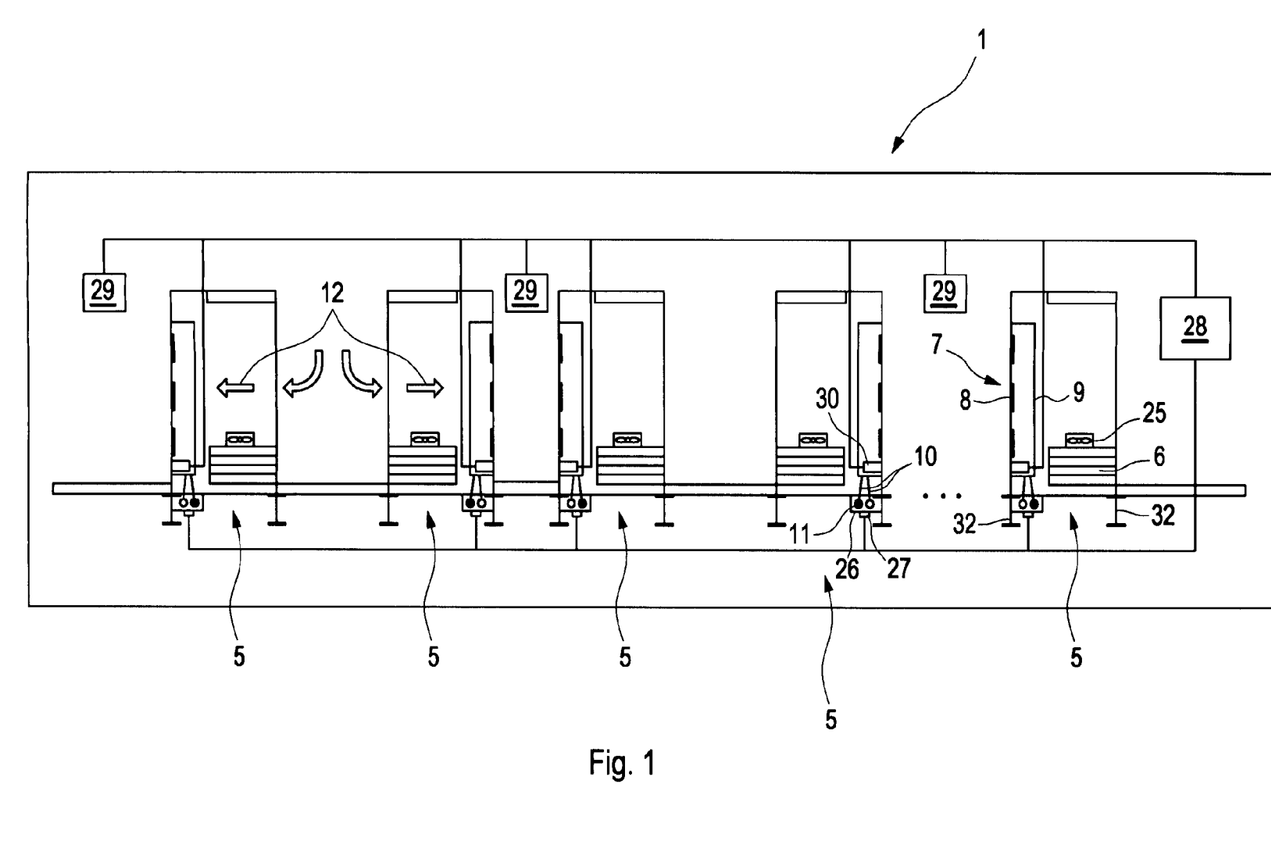
FIG. 1: schematically illustrates a mobile data centre unit according to the present disclosure.

In FIG. 1, a container 1 that can form a part of a mobile computing centre 2, 3, 4 (mobile data centre unit; see also FIGS. 2, 3 and 4) is depicted. The presently illustrated embodiment of a container 1 comprises a plurality of racks 5 that are provided with an internal space to contain electronic components 6 (presently only schematically shown), for example IT equipment or other types of computer equipment like equipment for a data centre server or data centre storage unit. In the presently depicted embodiment, any of the racks 5 comprise a separate heat exchanging unit (heat exchanging means) 7, wherein each heat exchanging units 7 comprises presently three heat exchangers 8 that are fluidly arranged in series. Furthermore, the heat exchanging unit 7 are attached to a door 9 that can be reversibly swung open or closed. For this, the door 9 is attached to hinges (presently not shown) and the fluid connection lines 10 for supplying the heat exchanging units 7 are designed flexible. The fluid connection lines 10 are forming a link between the piping system 11 and the heat exchanging units 7. In the presently shown embodiment, liquid is used as a coolant, so the heat exchanging units 7 are operating with a liquid coolant for cooling down the airflow 12, penetrating the respective heat exchanging unit 7.

Due to the mobile concept of the container 1, the racks 5 are mounted on shock absorbers 32 within the container 1.

As can be seen from FIG. 1, the racks 5 and/or the heat exchanging units 7 do not comprise any active means for generating/supporting an airflow 12 through the respective rack 5. Instead, the airflow is in part effectuated by passive means (e.g. a height difference between the air inlet port, where the airflow 12 enters the rack 5 and the air outlet port (presently falling together with the heat exchanging unit 7), where the airflow 12 leaves the rack 5). Another part of the airflow is effectuated by active means (for example cooling fans 25) of the electronic components 6, contained in the respective rack 5.

Using a fluid coolant (supplied by means of a piping system 10, 11) in combination with the presently proposed system is particularly beneficial in that the various racks 5 can be designed to be thermally passive with respect to the inner environment of the container 1 (i.e. no waste heat is dissipated into the interior of the container 1). Furthermore, the racks 5 no longer have to be designed as closed racks 5, which can facilitate monitoring and replacement of electronic components 6. Moreover, since the temperature of the electronic components 6 and/or the airstream 12 is comparatively low, even after passing the electronic components 6, heat dissipation to the outside of the various racks 5 (for example through the rack's 5 walls) can be effectively reduced to a minimum. Hence, it is no longer necessary to control a global air stream inside the container 1 (or another type of building structure). In particular, special channels for supplying and removing cold and hot air, respectively, are no longer needed. This way generation of hot spots which might occur due to some uncontrolled hot air flow outside the racks 5 can be effectively reduced or even avoided.

Additionally, the airflow throughout the container 1 (data centre building structure) does no longer have to be actively controlled, since the ambient temperature around the racks 5 is kept on a relatively cold level compared to the temperature inside the racks 5.

In order to implement an increased failure tolerance of the cooling infrastructure, the racks 5 can be operated in an even/odd fashion, where every second rack 5 is coupled to the same piping system 11, namely either a first or a second inner piping system 11. In this way, a residual cooling capacity can be maintained, even in case of a complete failure of one of the inner piping systems 11.

In the presently shown embodiment, the piping system 11 is provided with some kind of a trough 26. In case of a fluid leak along a pipe of the piping system 11, the leakage fluid can be collected in the trough 26 and guided to a sewage system, for example.

One advantage of this embodiment is that the electronic components 6 can be protected from getting in contact with the fluid. This is particularly advantageous, if the fluid is a liquid, in particular if the fluid is a liquid that is at least partially electrically conducting. This way, the electronic components 6 can be protected from any damage.

Furthermore, the trough 26 can be provided with leakage sensors 27. If one of the leakage sensors 27 detects the presence of any fluid (liquid) an appropriate signal is sent to a controlling unit 28, for example a small electronic computer. This controlling unit 28 can be placed in one of the racks 5, as well, of course.

In case of a such a failure, for instance due to a leak in the fluid connecting lines 10 and/or one of the heat exchangers 8 of a particular rack 5, the respective rack 5 can be selectively decoupled from the piping system 11 by actively actuatable valves 30 that are controlled by the controlling device 28. This control function can be performed by the controlling unit 28. Such a decoupled rack 5 will typically add thermal energy to the container's 1 interior due to the disabled heat exchanging unit 7, thus increasing the interior temperature of the container 1. In a preferred embodiment, the illustrated container 1 comprises at least 13 racks. In case of a failure of the single rack 5 this will increase the room temperature by less than 2° C., since the remaining heat exchangers 8 of the other racks 5 are still operational and are cooling the defective rack 5 through the air exchange with the inside of container 1.

As an additional means for detecting a leakage in the piping system 11, pressure transducers 31 are provided (see FIG. 2) that are electrically connected to a controlling unit 28.

Since there is no necessity to guide any air through specially provided channels throughout the data centre structure, the IT equipment/computer hardware racks 202 can be placed in any arbitrary arrangement very easily.

Rising the air temperature in the data centre (i.e. inside the container 1 and outside of the racks 5) will eventually lead to an increase of the coolant temperature (coolant, leaving the heat exchangers 8), which in turn increases the cooling efficiency of the outside chiller 15 and/or of the coolant circuit 17, 18.

In an operational mode, all air leaving the computer hardware of a rack 5 flows through the appropriate heat exchanging unit 7. Therefore, it is possible to detect overheating and burning inside the rack 5 by detecting smoke in the airflow 12. For this, smoke detectors 29 are provided that are electrically coupled to the controlling unit 28 as well. In case of such a failure, the primary power to the electronic components 6 in the defective rack 5 can be cut off by the controlling unit 28, preferably after attempting an emergency shutdown of the electronic components 6 in the rack 5. Normal computers do not present a significant fire load and therefore the disconnection of the primary power will usually prevent a critical rise or escalation of the problem. Having control over the primary power in a rack 5 allows to schedule the power-on event, in order to limit the rush-in currents. In a preferred embodiment of the disclosure the individual racks 5 negotiate a schedule for the powering-up of the computers.

Figure 2:
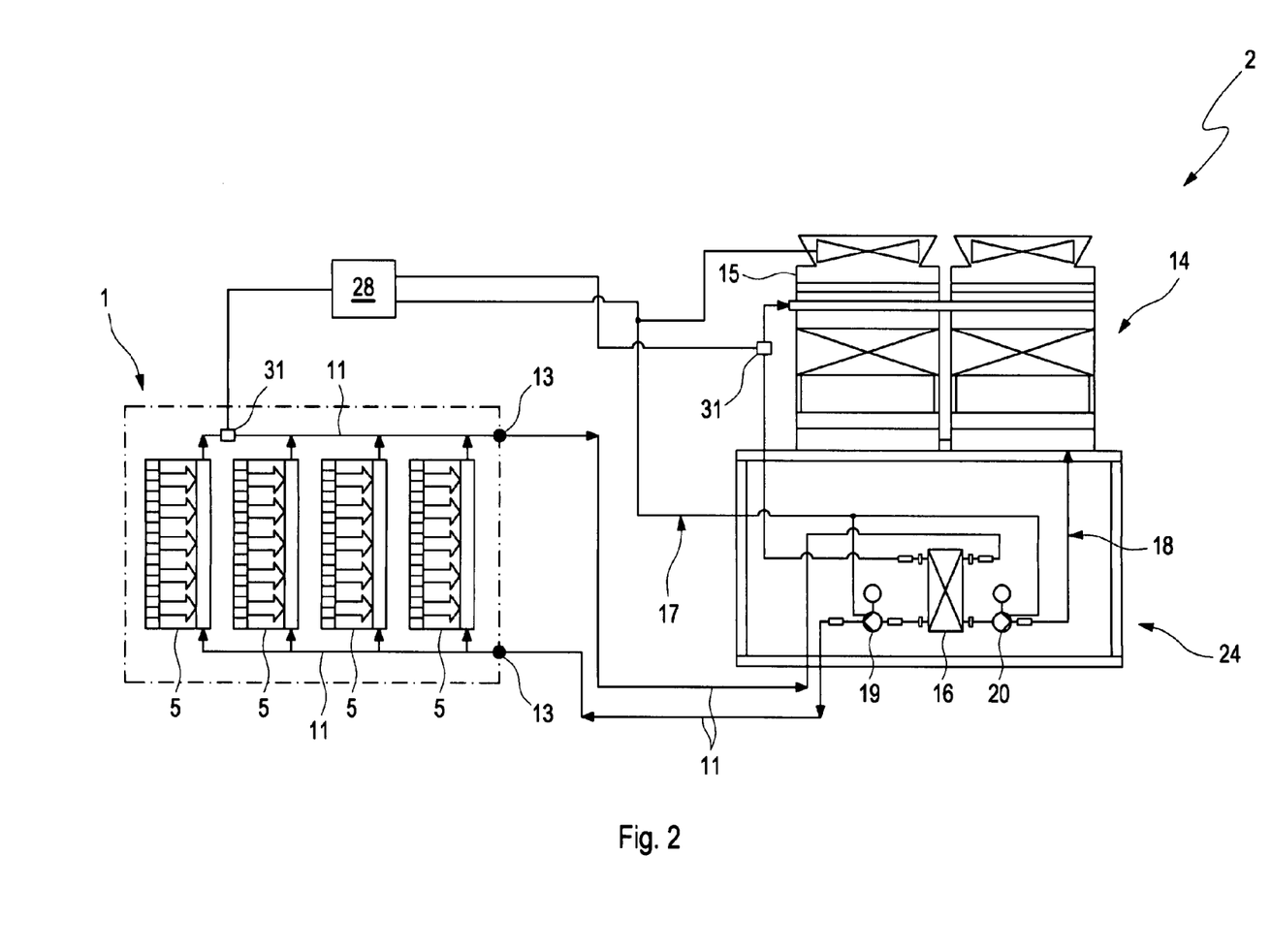
FIG. 2: schematically illustrates an example of a data centre unit comprising a container for the racks and an external cooling device, i.e. a chiller.

In FIG. 2, a first possible embodiment of a mobile computing centre 2, using the suggested embodiment of a container 1 according to FIG. 1 is shown in a schematic view. In an operational mode (as depicted), the mobile computing centre 2 comprises the container 1 with the electronic equipment 6 inside, as well as the cooling tower 14. If the mobile computing centre 1 is to be transported, the container 1 and the cooling tower 14 can be disconnected from each other, hence forming two separately transportable subunits. For an easy connection between the container 1 and the cooling tower 14, fluid connectors 13 are provided for the container 1 in the presently shown embodiment.

Further, according to the present embodiment of FIG. 2, the cooling tower 14 comprises a water chiller device 15, which is known in the state-of-the-art as such. Connected to the water chiller device 15, auxiliary components 24 are provided. In particular, in the embodiment of FIG. 2, a fluid-fluid-heat exchanger 16 is provided. This way, two separate cooling circuits 17, 18 are provided, namely a first cooling circuit 18 and a second cooling circuit 17. The two cooling circuits 17, 18 are fluidly separated from each other. Nevertheless, they are thermally coupled to each other by means of the fluid-fluid-heat exchanger 16. This way, any contamination of the fluid within the first cooling circuit 18 can be prevented to be transferred to the fluid in the second cooling circuit 17. Furthermore, it is possible to use different fluids for the respective cooling circuits 17, 18, so that a fluid can be chosen individually for each cooling circuit 17, 18, so that the respective fluid is better suited for the respective purpose. For circulating the respective fluid in the first and second cooling circuit 17, 18, two fluid pumps 19, 20 are provided. Preferably, the pumping rate of the two fluid pumps 19, 20 can be varied according to the actual cooling demands and/or the environmental conditions.

Figure 3:
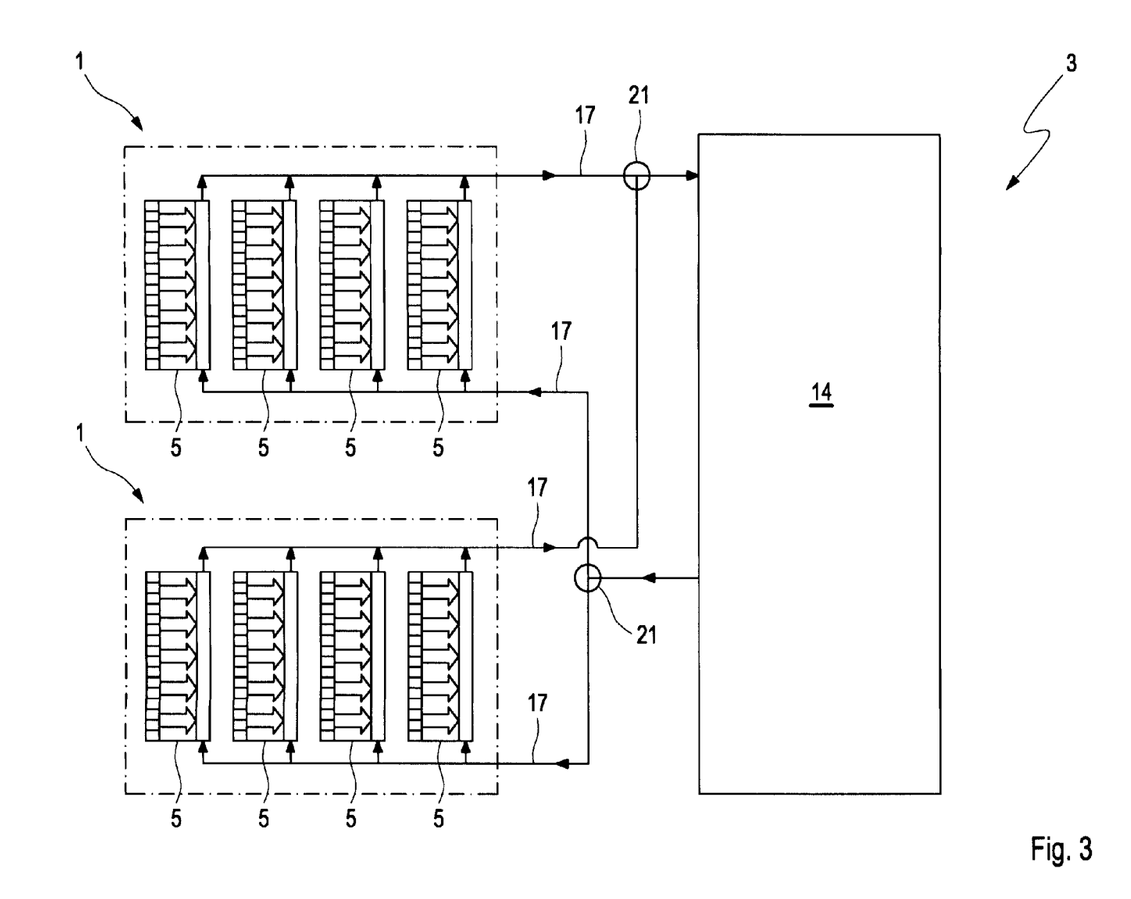
FIG. 3: schematically illustrates an example of a larger data centre comprising two containers with racks and additional components and a single chiller.

In FIG. 3 a second embodiment of a mobile computing centre 3 is depicted. The mobile computing centre 3 according to the presently shown embodiment is very similar to the mobile computing centre 2 according to the embodiment, shown in FIG. 2. However, presently two containers 1 are used for the mobile computing centre 3, so that the overall computing power of the resulting mobile computing centre 3 is significantly higher as compared to the embodiment of a mobile computing centre 2 according to FIG. 2. To reduce the overall complexity of the mobile computing centre 3, the two (second) cooling circuits 17 of the two containers 1 are connected in parallel to the common cooling tower 14, used for cooling the fluid within the cooling circuits 17. "Parallel cooling circuits 17" means in the presently shown example that a single fluid line leaving and entering the cooling tower 14 is split up and rejoined at two tee connectors 21 to/from two individual second fluid circuits 17.

Figure 4:
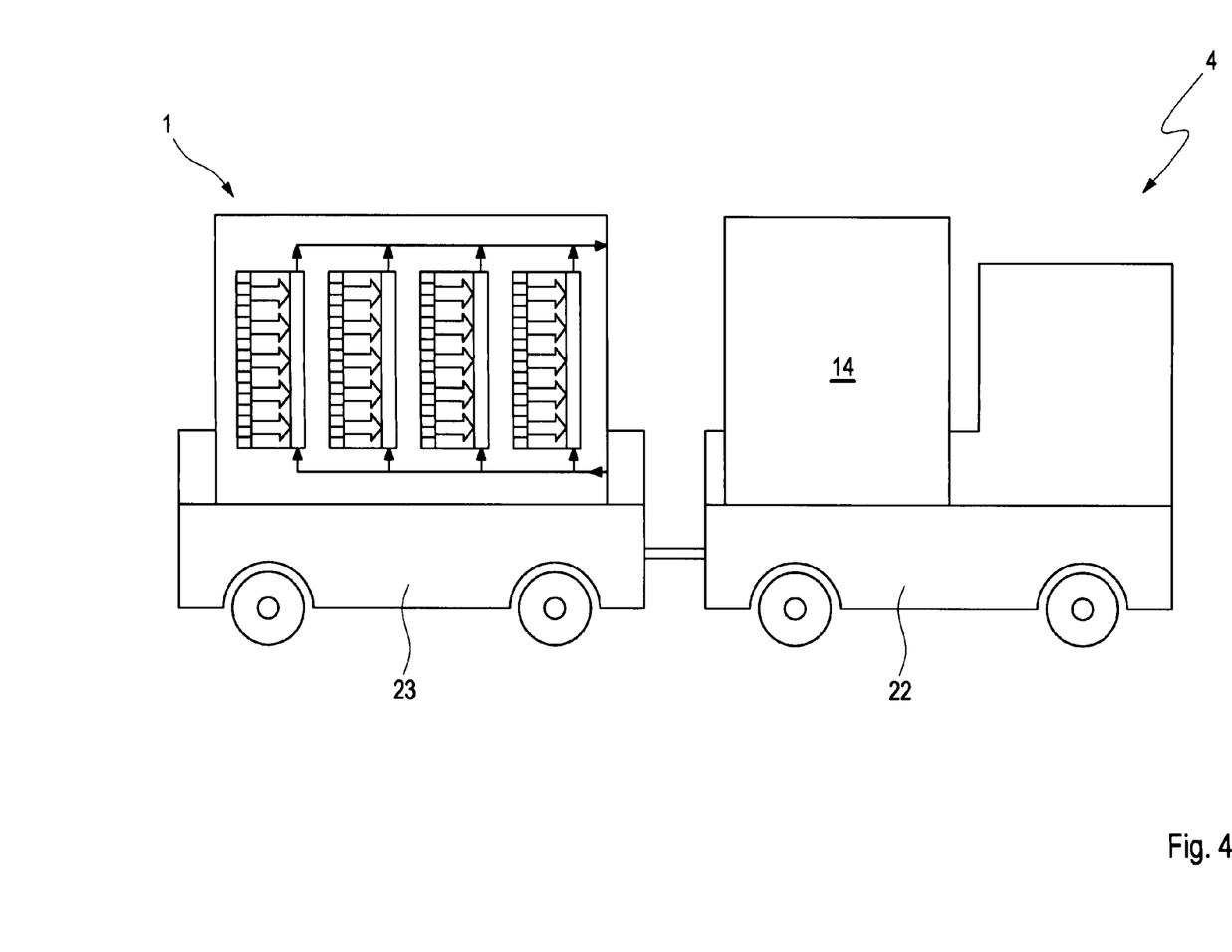
FIG. 4: schematically illustrates a container and a chiller on a movable device, e.g. a truck.

In FIG. 4, finally, an embodiment of a mobile computing centre 4 is shown in a transportation state. In the presently shown embodiment, the container 1 is loaded onto a trailer 23, while the cooling tower 14 is loaded onto a truck 22. In this state, the connecting water pipes between the container 1 and the cooling tower 14 are disconnected to facilitate transportation of the mobile computing centre 4.

EXAMPLE 1

A mobile data centre container having 3 m width, 2.9 m height and 12.2 m length is equipped with 13 19" racks, each having IT equipment which operates at 20 kW. The total power of 260 kW is cooled by a hybrid cooler. The water pump requires 14 kW and the hybrid cooler requires an additional 4 kW (if the outside temperature is above a certain limit, like 15° C.), which results in a power utility efficiency of PUE=1.06.

EXAMPLE 2

A mobile data centre container having 3 m width, 2.9 m height and 12.2 m length is equipped with 13 19" racks, each having IT equipment which operates at 35 kW. The total power of 455 kW is cooled back by a hybrid cooler. The water pump requires 20 kW and the hybrid cooler requires an additional 5 kW, which results in a power utility efficiency of PUE=1.05. The improved cooling efficiency is based on the higher efficiency of the rack's heat exchangers due to higher internal temperatures at this operating point.

The invention claimed is:
1. Mobile data centre unit comprising:
  i. a plurality of containers,
  ii. each of the plurality of containers comprising at least one rack for housing electronic equipment, and at least one coolant conduit,
  iii. the at least one rack comprising at least one heat exchanging means being adapted to transfer heat contained in an internal airflow, where the internal airflow has been heated up by the electronic equipment to be contained inside the rack to a fluid coolant, said heat exchanging means being located at least one wall or element of the at least one rack,
  iv. the at least one coolant conduit being adapted to supply the heat exchanging means of the at least one rack with a fluid coolant and is further adapted to convey the heated coolant away through a reflux section of the coolant conduit,
  v. a heat exchanging device shared in common between the plurality of containers and disposed outside the plurality of containers for cooling the fluid coolant heated during operation of the mobile date center unit, and including:
  vi. a fluid-fluid-heat exchanger,
  vii. a first cooling circuit including a first pump, and
  viii. a second cooling circuit fluidly separated from the first cooling circuit but thermally coupled to the first cooling circuit by the fluid-fluid-heat exchanger and including:
  ix. a second pump controlled independently of the first pump, and
  x. a plurality of cooling circuits in fluid communication with the heat exchanging means of the plurality of containers;
  xi. connecting means for connecting the at least one coolant conduit to said heat exchanging device for conveying the heated coolant from said at least one heat exchanging means comprised by said at least one rack to said heat exchanging device outside the plurality of containers when the connecting means are connected,
  xii. wherein, for transportation of the mobile data centre unit, the plurality of containers and the heat exchanging device are disconnectable from each other to form multiple separately transportable subunits, and
  xiii. wherein said at least one rack is designed and arranged in a way that the internal airflow within the rack is predominantly effectuated by passive airflow generating means and/or by active airflow generating means of at least a part of the electronic equipment to be contained in the rack.

2. Mobile data centre unit according to claim 1, wherein at least one rack comprises electronic equipment, in particular power electronics, IT equipment and/or computer equipment.

3. Mobile data centre unit according to claim 1, and wherein at least a part of the internal airflow within at least one rack is effectuated at least in part and/or at least at times by active means of at least a part of the electronic equipment to be contained in the rack.

4. Mobile data centre unit according to claim 1, wherein the at least one rack is designed and arranged in a way that a heat dissipation rate of at least 1 kW, preferably at least 5 kW, even more preferred at least 10 kW, particularly at least 15 kW per rack can be handled.

5. Mobile data centre unit according to claim 1, wherein each of the plurality of containers has the size of a container according to accepted standards, which can preferably be transported, loaded and unloaded, stacked and transported efficiently over long distances by ship, rail, trucks, semi-trailer trucks or planes.

6. Mobile data centre unit according to claim 1, wherein the at least one rack is placed on a floor of each of the plurality of containers and/or the at least one rack is connected to each of the plurality of containers via shock-absorbing means.

7. Mobile data centre unit according to claim 1, wherein the at least one heat exchanging means is arranged at least in part on a back wall of the at least one rack and/or wherein at least one heat exchanging means is arranged at least in part on a door means and/or wherein the at least one rack is designed, at least in part, as an open rack.

8. Mobile data centre unit according to claim 1, wherein at least one of the heat exchanging means is designed at least in part as an air flow penetrable heat exchanging means.

9. Mobile data centre unit according to claim 1, wherein the at least one heat exchanging means of at least one rack is dimensioned and capable to transfer the entire heat generated by the electronic equipment to the coolant, at least on the time average.

10. Mobile data centre unit according to claim 1, wherein the coolant is transported within at least a part of the coolant circuit with a pressure lower than 2 bars, preferably lower than atmospheric pressure.

11. Mobile data centre unit according to claim 1, wherein at least a part of the coolant conduit comprises at least one safety barrier, designed and arranged in a way to prevent any liquid, in particular any leakage liquid and/or any condensation liquid to come into contact with the electronic equipment and/or wherein at least a part of the coolant conduit comprises at least one sensor means for detecting and/or monitoring the pressure in the coolant conduit.

12. Mobile data centre unit according to claim 1, the heat exchanging device being, in particular a chiller device that is preferably designed as a water chiller device and/or as a hybrid cooler device.

13. Mobile data centre unit according to claim 1, wherein at least part of the at least one coolant conduit and/or at least a part of an additional means for conveying coolant are designed as flexible means, and/or are comprising steel, stainless steel and/or synthetic organic polymer materials.

14. Mobile data centre unit according to claim 1, wherein at least some or all of the racks comprise at least one control means, preferably at least one switching control means which is adapted to selectively switch off the hardware, rack and/or the relevant portion of the coolant conduit and/or at least one monitoring control means comprising at least one leak detector for the cooling circuit and/or at least one smoke detector.

15. Mobile data centre unit according to claim 1, comprising at least one regulating control means, regulating the functionality of at least one heat exchanging means and/or of at least an external heat exchanging device and/or at least parts of the at least one coolant conduit.

16. Mobile data centre unit comprising:
  (i) at least one container,
  (ii) the at least one container comprising a plurality of racks for housing IT equipment,
  (iii) the racks comprising heat exchanging means being adapted to transfer heat contained in an internal airflow, where the internal airflow has been heated up by the IT equipment to be contained inside the racks to a liquid coolant, said heat exchanging means being located at least one wall or element of the associated rack, (iv) at least one coolant conduit which is adapted to supply the heat exchanging means of the racks with a liquid coolant and is further adapted to convey the heated liquid coolant away through a reflux section of the coolant conduit, wherein the at least one coolant conduit includes a plurality of cooling circuits in fluid communication with the heat exchanging means of the plurality of racks in the at least one container;

(v) at least one external heat exchanging device outside the at least one container for cooling the liquid coolant heated during operation of the mobile data centre unit, (vi) connecting means for connecting the at least one coolant conduit to said at least one external heat exchanging device for conveying the heated coolant from said heat exchanging means comprised by said racks to said at least one external heat exchanging device outside the at least one container when the connecting means are connected, (vii) wherein for transportation of the mobile data centre unit the at least one container and the at least one external heat exchanging device are disconnectable from each other and are formed as at least two separately transportable subunits, and (viii) wherein said racks are designed and arranged in a way that the internal airflow within the racks is predominantly effectuated by passive airflow generating means and/or by active airflow generating means of at least a part of the IT equipment to be contained in the racks, wherein the heat exchanging means are designed at least in part as air flow penetrable heat exchanging means, and wherein the racks are designed, at least in part, as open racks, so that it is not necessary to guide cooling air across the racks through additional air vents, (ix) wherein a Power Usage Effectiveness PUE of power for cooling of the mobile data centre, which is calculated by PUE=total facility power/IT equipment power, is <1.1.

17. Mobile data centre unit according to claim 16, wherein the Power Usage Effectiveness PUE of power for cooling of the mobile data centre, which is calculated by PUE=total facility power/IT equipment power is <1.06.

18. Mobile data centre unit according to claim 16, wherein the at least one container is equipped with 13 or more racks, which operate at 20 kW or more each, wherein the Power Usage Effectiveness PUE of power for cooling of the mobile data centre, which is calculated by PUE=total facility power/IT equipment power is <1.06.

19. Mobile data centre unit according to claim 16, wherein the at least one container has the size of a container according to accepted standards, which can preferably be transported, loaded and unloaded, stacked and transported efficiently over long distances by ship, rail, trucks, semi-trailer trucks or planes.

20. Mobile data centre unit according to claim 16, wherein the racks are placed on the floor of the at least one container and/or the racks are connected to the at least one container via shock-absorbing means.

21. Mobile data centre unit according to claim 16, wherein the heat exchanging means are arranged at least in part on a back wall of the associated rack and wherein the racks do not comprise a front door or comprise a front door which is open for fluid flow, so as to allow air to flow through without substantial flow resistance.

22. Mobile data centre unit according to claim 16, wherein each of the racks comprises a swingable back door, wherein the heat exchanging means are arranged at least in part on the swingable back door of the associated rack and wherein the racks do not comprise a front door or comprise a front door which is open for fluid flow, so as to allow air to flow through without substantial flow resistance.

23. Mobile data centre unit according to claim 16, wherein the racks have a power density of 20 kW or more each and wherein the heat exchanging means of the racks are dimensioned and capable to transfer the entire heat generated by the electronic equipment to the coolant, at least on the time average.

24. Mobile data centre unit according to claim 16, wherein the coolant is transported within at least a part of the at least one coolant conduit with a pressure lower than 2 bars, preferably lower than atmospheric pressure.

25. Mobile data centre unit according to claim 16, wherein at least a part of the coolant conduit comprises at least one safety barrier, designed and arranged in a way to prevent any liquid, in particular any leakage liquid and/or any condensation liquid to come into contact with the electronic equipment and/or wherein at least a part of the coolant conduit comprises at least one sensor means for detecting and/or monitoring the pressure in the coolant conduit.

26. Mobile data centre unit according to claim 16, comprising at least one external heat exchanger device, in particular a chiller device that is preferably designed as a water chiller device and/or as a hybrid cooler device.

27. Mobile data centre unit according to claim 16, wherein at least part of the at least one coolant conduit and/or at least a part of an additional means for conveying coolant are designed as flexible means, and/or are comprising steel, stainless steel and/or synthetic organic polymer materials.

28. Mobile data centre unit according to claim 16, wherein at least some or all of the racks comprise at least one control means, preferably at least one switching control means which is adapted to selectively switch off the hardware, rack and/or the relevant portion of the coolant conduit and/or at least one monitoring control means comprising at least one leak detector for the at least one cooling conduit and/or at least one smoke detector.

29. Mobile data centre unit according to claim 16, comprising at least one regulating control means, regulating the functionality of the heat exchanging means and/or of the at least one external heat exchanging device and/or of at least parts of the at least one coolant conduit.

30. Mobile data centre unit according to claim 16, wherein the at least one container does not have cold aisles or hot aisles.

* * * * *